(12) United States Patent
Shiimoto et al.

(10) Patent No.: US 7,433,220 B2
(45) Date of Patent: Oct. 7, 2008

(54) TWO VARIABLE RESISTANCE ELEMENTS BEING FORMED INTO A LAMINATED LAYER WITH A COMMON ELECTRODE AND METHOD OF DRIVING THE SAME

(75) Inventors: Tsunenori Shiimoto, Tokyo (JP); Katsuhisa Aratani, Chiba (JP); Masaaki Hara, Tokyo (JP); Tomohito Tsushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 74 days.

(21) Appl. No.: 11/264,939

(22) Filed: Nov. 2, 2005

(65) Prior Publication Data
US 2006/0092691 A1 May 4, 2006

(30) Foreign Application Priority Data
Nov. 2, 2004 (JP) .............................. 2004-319655

(51) Int. Cl.
*G11C 11/22* (2006.01)
(52) U.S. Cl. ....................................................... 365/145
(58) Field of Classification Search ................. 365/129, 365/130 X, 145 O, 158, 171, 173, 130, 145
See application file for complete search history.

(56) References Cited

U.S. PATENT DOCUMENTS 6,087,674 A    7/2000   Ovshinsky et al.
6,977,835 B2 * 12/2005  Kang ......................... 365/145
7,129,133 B1  10/2006   Avanzino et al.
2003/0234449 A1 12/2003 Aratani et al.

OTHER PUBLICATIONS

Phys. Rev. Lett. 21, (1968) p. 1450 by S.R. Ovshinsky is cited as an example of a phase change memory device.

* cited by examiner

*Primary Examiner*—VanThu Nguyen
(74) *Attorney, Agent, or Firm*—Wolf, Greenfield & Sacks, P.C.

(57) ABSTRACT

A memory element having a configuration in which contents of recorded data can be judged easily and power consumption can be reduced, and a method of driving the same are provided. A memory element 10 of the present invention includes variable resistance elements 11 and 12 whose resistance state changes reversibly between a high resistance state and a low resistance state by applying a voltage of a different polarity between an electrode 1 of one side and an electrode 2 of the other side; the electrode 1 of one side in each element of the two variable resistance elements 11 and 12 is made a common electrode; and the electrode 2 of the other side in each element of the two variable resistance elements 11 and 12 is made independent and is provided respectively with the terminal X and terminal Y, to form a memory cell having two terminals in total.

13 Claims, 7 Drawing Sheets

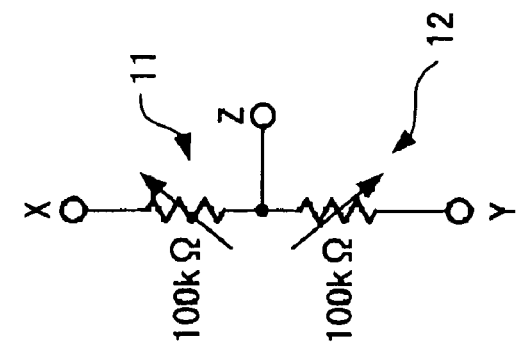
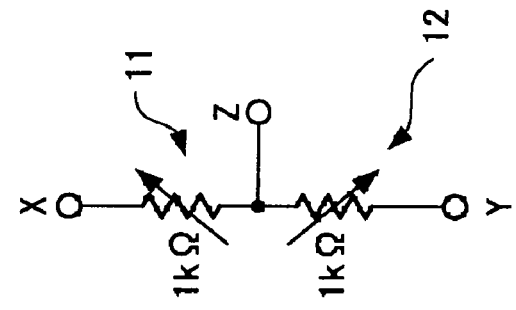
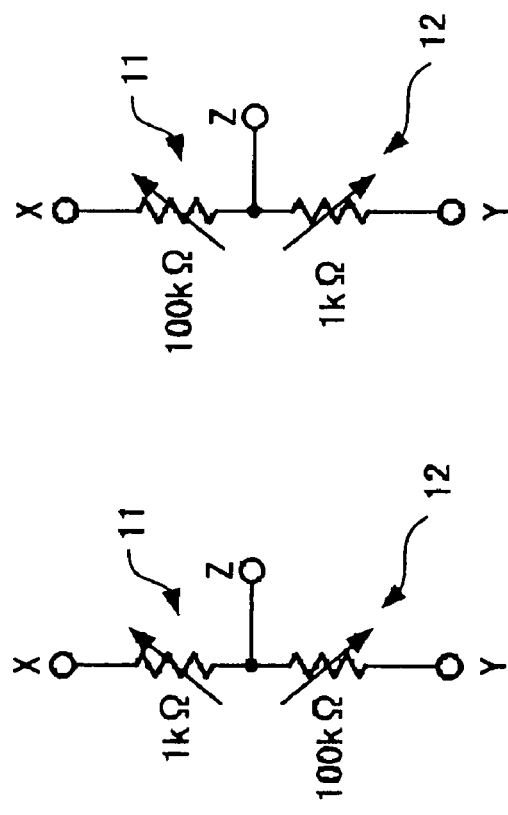
FIG. 3A (RELATED ART) S=1 State
FIG. 3B (RELATED ART) S=0 State
FIG. 3C (RELATED ART) Intermediate State
FIG. 3D (RELATED ART) Forbidden State S=1 State   S=0 State   Intermediate State   Forbidden State

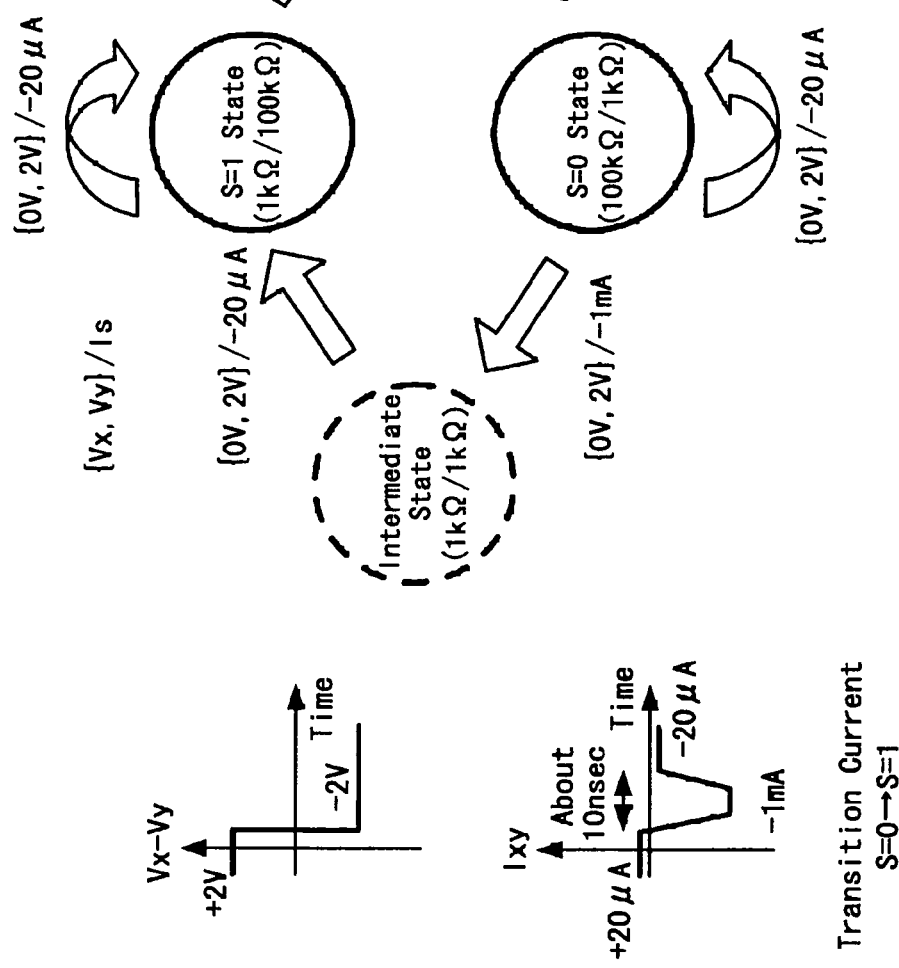

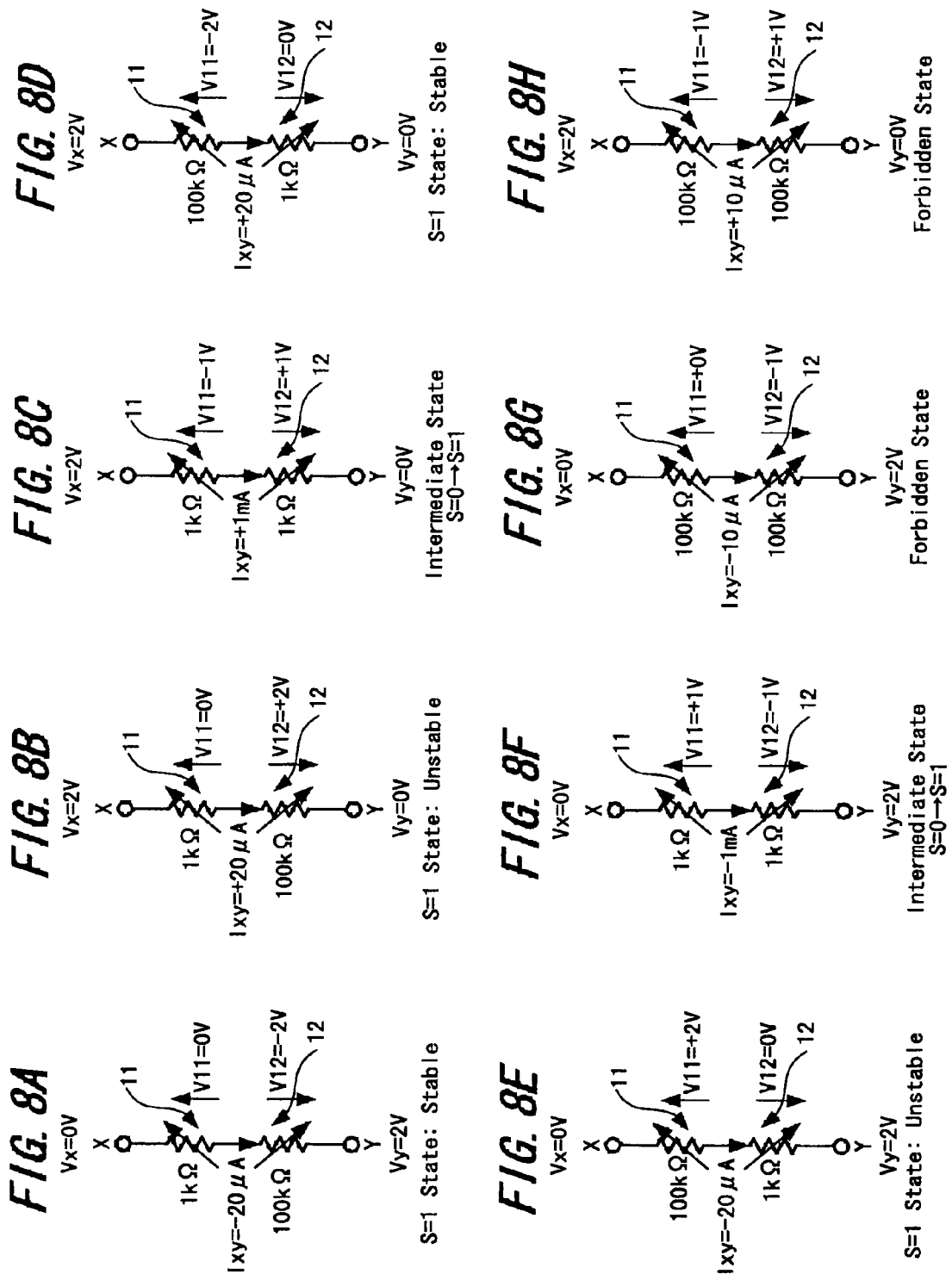

TWO VARIABLE RESISTANCE ELEMENTS BEING FORMED INTO A LAMINATED LAYER WITH A COMMON ELECTRODE AND METHOD OF DRIVING THE SAME

CROSS REFERENCES TO RELATED APPLICATIONS

The present invention contains subject matter according to Japanese Patent Application JP 2004-319655 filed in the Japanese Patent Office on Nov. 2, 2004, the entire contents of which being incorporated herein by reference.

BACKGROUND OF THE INVENTION

1. Field of the Invention

The present invention relates to a memory element and a method of driving the same, which are suitable to be used in a nonvolatile memory.

2. Description of the Related Art

A DRAM of high-speed operation and high density has been used widely as a random access memory in an information apparatus such as a computer.

However, the DRAM is a volatile memory in which information disappears when the power is shut off, and it is necessary to perform a refreshing operation frequently, specifically, to perform an operation in which information (data) written therein is read, again amplified, and rewritten.

Accordingly, there is a demand for a nonvolatile memory in which information does not disappear even when the power is shut off.

A semiconductor flash memory has been put into practical use as a nonvolatile memory.

Further, other than the above, a nonvolatile device such as an FeRAM (ferroelectric memory) and MRAM (magnetic memory element), for example, has been proposed as a non-volatile device that includes a nonvolatile memory (refer to Non-patent reference 1).

[Non-patent reference 1] Nikkei electronics, 2001. 2. 12 issue (pp. 164 to 171)

SUMMARY OF THE INVENTION

The applicants of the present invention have previously proposed a nonvolatile variable resistance element that may have a characteristic superior to the above-described various kinds of nonvolatile devices.

As shown in a cross-sectional diagram of FIG. 1A, for example, this variable resistance element has a film structure that has a conductive film 103 and a insulation film 104 between two electrodes 101 and 102. When a voltage is applied to make an electric current I flow from the conductive film 103 toward the insulation film 104, a variable resistance element 105 changes to a low resistance and data is written, and when a voltage is applied to make an electric current flow from the insulation film 104 toward the conductive film 103, the variable resistance element 105 changes to a high resistance and data is erased.

Further, as shown in FIG. 1B, for example, this variable resistance element 105 is described using a circuit symbol similar to that of a typical variable resistor, and a direction of an arrow mark is determined to be the same direction as the direction of the electric current I at the time of writing shown in FIG. 1A.

However, when a readout voltage is applied to the variable resistance element that has become the low resistance, power consumption becomes large since a large electric current flows.

The present invention addresses the above-identified and other problems associated with conventional methods and apparatuses, and provides a memory element having a configuration in which information can be stored without volatility and the power consumption can be reduced, and a method of driving the same.

A memory element according to an embodiment of the present invention includes a variable resistance element whose resistance state changes reversibly between a high resistance state and a low resistance state by applying a voltage of a different polarity between an electrode of one side and an electrode of the other side, in which the electrode of one side in each element of two of the variable resistance elements is made a common electrode and the electrode of the other side in each element of two of the variable resistance elements is made independent and is respectively provided with a terminal, to form a memory cell having two terminals in total.

In the memory element according to the embodiment of the present invention, since the memory cell is configured to have two terminals in total such that the electrode of one side in each element of the two variable resistance elements is connected to be made the common electrode and the electrode of the other side in each element of the two variable resistance elements is made independent and is respectively provided with the terminal, and since the electrode of one side is the common electrode, recording of information can be performed by operating those two variable resistance elements complementarily.

Further, when the two variable resistance elements are formed into a laminated layer, for example, a memory device integrating a large number of memory elements can be integrated into a small area.

Specifically, since the electrode of one side is the common electrode, the two variable resistance elements are connected in series between the electrodes of the other sides of the two variable resistance elements. Further, when a voltage is applied between those electrodes of the other sides, the voltage acts on the variable resistance element of one side of the two variable resistance elements to change from the high resistance state to the low resistance state, and acts on the variable resistance element of the other side to change from the low resistance state to the high resistance state. Hence, it is possible to change the variable resistance element of one side to the low resistance state and the variable resistance element of the other side to the high resistance state, respectively, and the state after that change can be maintained stably.

Further, when a voltage of a reverse polarity to the above-described voltage is applied between the electrodes of the other sides, the variable resistance element of one side changes to the high resistance state and the variable resistance element of the other side changed to the low resistance state, respectively, and thereby a combination of the resistance states of the first variable resistance element and second variable resistance element is changed and information can be rewritten.

Using the above, two kinds of information "1" and "0", for example, can be stored in each memory cell.

Further, when the resistance state of the two variable resistance elements changes, the variable resistance element of the high resistance state first changes to the low resistance state, after that, the variable resistance element of the low resistance state changes to the high resistance state, and so both of the two variable resistance elements go through a intermediate state of the low resistance state.

Furthermore, since the period of time in the intermediate state is short and one of the two variable resistance elements is in the high resistance state other than that time, a combined resistance of the whole memory cell becomes large and an electric current that flows in the memory cell is small. Hence, the electric current that flows by applying the voltage to the memory cell can be reduced when recording and erasing information, and reading information.

A memory element according to an embodiment of the present invention includes a variable resistance element whose resistance state changes reversibly between a high resistance state and a low resistance state by applying a voltage of a different polarity between an electrode of one side and an electrode of the other side, in which the memory element is formed of the two variable resistance elements, and the variable resistance element includes an insulation film that is formed in each element respectively and a conductive film that is formed in common in the two of the above-described variable resistance elements to have a characteristic of changing from the high resistance state to the low resistance state when a voltage is applied to make an electric current flow from the conductive film toward the insulation film and of changing from the low resistance state to the high resistance state when a voltage is applied to make an electric current flow from the insulation film toward the conductive film.

In the memory element according to the embodiment of the present invention, since the memory element is formed of two variable resistance elements, and since the variable resistance element has a structure including the insulation film that is formed in each element respectively and the conductive film that is formed in common in the two of the variable resistance elements, the recording of information can be performed by changing the resistance state from the high resistance state to the low resistance state when the voltage is applied to make the electric current flow from the conductive film toward the insulation film, and by complementarily operating to change the state from the low resistance state to the high resistance state when the voltage is applied to make the electric current flow from the insulation film toward the conductive film.

Further, when those two variable resistance elements are formed into a laminated layer, for example, a memory device integrating a large number of memory elements can be integrated into a small area.

A method of driving a memory element according to an embodiment of the present invention is a method of driving a memory element which includes a variable resistance element whose resistance state changes reversibly between a high resistance state and a low resistance state by applying a voltage of a different polarity between an electrode of one side and an electrode of the other side and in which the electrodes of one side in each element of two of the variable resistance elements are connected and the electrode of the other side in each element of two of the variable resistance elements is made independent and is respectively provided with a terminal, to form a memory cell having two terminals in total; including the steps of: setting a threshold value of voltage respectively when the variable resistance element changes reversibly between the high resistance state and the low resistance state, recording information by applying a larger voltage than the threshold value of voltage to the terminals at both ends of the memory element and reading information recorded in the memory element by detecting a presence or absence of a transition current that flows at the time of the recording of information.

In the method of driving the memory element according to the embodiment of the present invention, the memory element is configured such that an electrode of one side in each element of variable resistance elements is made common and the variable resistance element has the threshold value of voltage respectively when the variable resistance element changes reversibly between the high resistance state and the low resistance state at the time of driving the memory element of the embodiment of the present invention. The recording and erasure of information is performed by applying a larger voltage than the threshold value of voltage to the terminals at the both ends of the memory elements; the recording and erasure of information can be performed by easily changing the combination of the resistance states of the first variable resistance element and second variable resistance element; and the information can be easily read by detecting the presence or absence of the transition current at the time of reading the information.

A method of driving a memory element according to an embodiment of the present invention is a method of driving a memory element which includes a variable resistance element whose resistance state changes reversibly between a high resistance state and a low resistance state by applying a voltage of a different polarity between an electrode of one side and an electrode of the other side, and in which the memory element is formed of two of the variable resistance elements, the variable resistance element includes an insulation film that is formed in each element respectively and a conductive film that is formed in common in the two of the above-described variable resistance elements and terminals are provided respectively with the both electrodes on the side of the insulation film of each variable resistance element to form a memory cell having two terminals in total; including the steps of: setting a threshold value of voltage respectively when the variable resistance element changes reversibly between the high resistance state and the low resistance state, recording information by applying a larger voltage than the threshold value of voltage to the terminals at both ends of the memory element and reading information recorded in the memory element by detecting a presence or absence of a transition current that flows at the time of the recording of information.

In the method of driving the memory element according to the embodiment of the present invention, the memory element is configured such that the conductive film of each variable resistance element is shared, and the variable resistance element has the threshold value of voltage respectively at the time of changing reversibly between the high resistance state and the low resistance state when the memory element of the embodiment of the present invention is driven. The recording and erasure of information is performed by applying a larger voltage than the threshold value of voltage to the terminal at the both ends of the memory elements, the recording and erasure of information can be performed by easily changing the combination of the resistance states of the first variable resistance element and second variable resistance element, and the information can be read easily by detecting the presence or absence of the transition current at the time of reading the information.

According to the above-described embodiments of the present invention, the variable resistance element of one side can be changed to the low resistance state and the variable resistance element of the other side can be changed to the high resistance state respectively and the state after the change can be maintained stably; and therefore information can be stored stably in the memory cell by storing the information in the memory cell using this operation. Hence, it is possible to store the information without volatility in the memory element.

Further, since the electric current that flows when applying the voltage to the memory element can be reduced at the time of recording information and reading information, the power consumption can be reduced.

BRIEF DESCRIPTION OF THE DRAWINGS

FIGS. 3A through 3D are diagrams showing a possible state of the memory element of FIG. 2A;

FIG. 7A is a state transition diagram explaining an operation in a case where a writing voltage is applied to the memory element of FIG. 4A, FIG. 7B is a diagram explaining a transition current from a "S=1 state" to a "S=0 state", and FIG. 7C is a diagram explaining a transition current from the "S=0 state" to the "S=1 state";

FIGS. 8A through 8H are diagrams showing an example of voltage distribution in each state of FIGS. 6A through 6D.

DESCRIPTION OF THE PREFERRED EMBODIMENTS

Hereinafter, an embodiment of the present invention is explained by referring to the accompanied drawings.

Figure 1A:
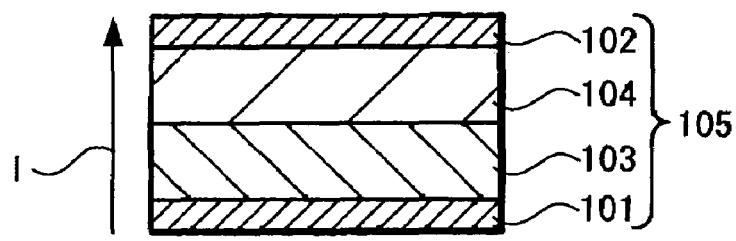
FIG. 1A is a cross-sectional diagram showing a film structure of a variable resistance element.
Figure 1B:
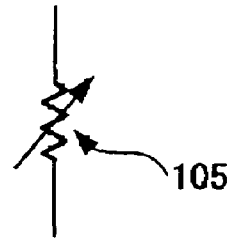
FIG. 1B is a diagram showing a circuit symbol of the variable resistance element of FIG. 1A.
Figure 2A:
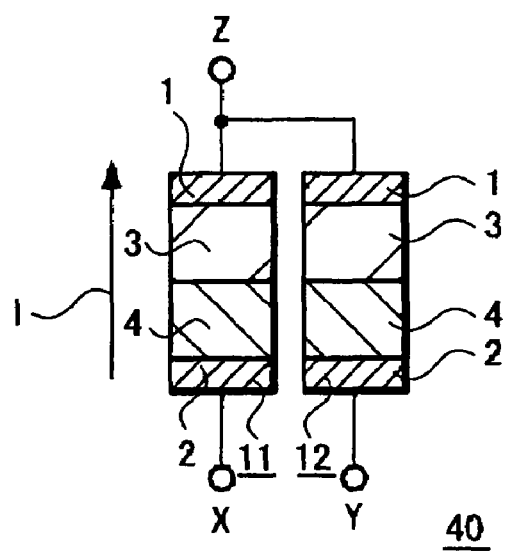
FIG. 2A is a schematic configuration diagram of a memory element according to related art.
Figure 2B:
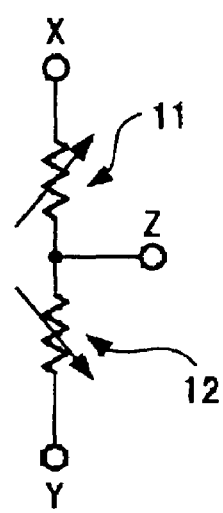
FIG. 2B is a circuit configuration diagram of the memory element of FIG. 2A.

In order to facilitate understanding of the present invention, a reference example of FIG. 2 (configuration of related art) is explained. Schematic configuration diagrams of a memory element of related art are shown in FIGS. 2A and 2B. FIG. 2A is a schematic configuration diagram, and FIG. 2B is a circuit configuration diagram.

A memory element 40 includes a first variable resistance element 11 and a second variable resistance element 12, both of which are nonvolatile, as shown in FIG. 2A. Both of the variable resistance elements 11 and 12 are made into a film structure in which a conductive film 3 and an insulation film 4 are provided between electrodes 1 and 2.

Further, in the two variable resistance elements 11 and 12, the electrodes 1 on the side of the conductive film 3 are connected to be a common terminal Z and the electrodes 2 on the side of the insulation film 4 are connected to an terminal X and to a terminal Y respectively, and so the memory element 40 having complementary three terminals is obtained. Shown with a circuit symbol, arrow marks of the two variable resistance elements 11 and 12 become back to back as shown in FIG. 2B.

A metal film, alloy film (for example, a CuTe alloy film), metal compound film, and the like that contain a metal element such as Cu, Ag, and Zn, for example, can be listed as the conductive film 3 that constitutes the first and second variable resistance elements 11 and 12.

Further, an insulator of an amorphous $Gd_2O_3$, $SiO_2$ and the like, for example, can be listed as the insulation film 4.

As a specific film structure, a CuTe film having the film thickness of 20 nm is formed as the conductive film 3, and an amorphous $Gd_2O_3$ film having the film thickness of 5 nm is formed thereon as the insulation film 4, for example.

When such material films are used, those material films have a property that the metal element such as Cu, Ag, and Zn contained in the conductive film 3 is ionized and drawn to a cathode side.

Therefore, when a voltage is applied between the upper and lower electrodes 1 and 2 of the variable resistance elements 11 and 12 such that the electrode 2 on the side of the insulation film 4 becomes low potential, the ion of the metal element is drawn to the electrode 2 and enters the insulation film 4. Further, when the ion reaches the electrode 2, the resistance value decreases due to the conduction between the upper and lower electrodes 1 and 2.

On the other hand, when a voltage is applied between the upper and lower electrodes 1 and 2 of the variable resistance elements 11 and 12 such that the electrode 1 on the side of the conductive film 3 becomes low potential, the resistance value rises due to the increase in electric insulation between the upper and lower electrodes 1 and 2, because the metal element is ionized and drawn to the electrode 1 from the insulation film 4.

The resistance values of the variable resistance elements 11 and 12 can be changed reversibly between the high resistance state and the low resistance state by repeating such change.

The variable resistance elements 11 and 12 of such film structure have an advantage with respect to scaling, because there is no dependence on a size of an element and a large signal can be obtained.

Further, The variable resistance elements 11 and 12 also have such advantages that a data writing speed by the resistance change can be made faster to be around 5 nanoseconds, for example, and it is possible to operate at a low voltage (for example, around 1V) and at a low current (for example, around 20 μA).

Next, specific operation in the configuration of the memory element 40 shown in FIG. 2 is explained.

First, four possible states with respect to this memory element 40 are shown in FIGS. 3A to 3D.

Further, as shown in FIG. 3A, a state in which the first variable resistance element 11 connected to the terminal X is in a low resistance (1 kΩ, for example) and the second variable resistance element 12 connected to the terminal Y is in a high resistance (100 kΩ, for example) is defined as an "S=1 state" and as shown in FIG. 3B, a state in which the first variable resistance element 11 connected to the terminal X is in a high resistance (100 kΩ, for example) and the second variable resistance element 12 connected to the terminal Y is in a low resistance (1 kΩ, for example) is defined as an "S=0 state".

Furthermore, as shown in FIG. 3C, a state in which both of the two variable resistance elements 11 and 12 are in the low resistances is called an "intermediate state" and as shown in FIG. 3D, a state in which both of the two variable resistance elements 11 and 12 are in the high resistances is called a "forbidden state".

Since the common terminal Z is required between each of the variable resistance elements 11 and 12, and both the variable resistance elements 11 and 12 are connected in a planar manner in the above-described memory element 40, it has been difficult to integrate the element into a small planar area when a large number of such memory elements 40 are integrated to form a memory device (what is called a memory).

Hereupon, an embodiment of the present invention in which an integration rate is improved as compared with the above-described memory element is explained using FIGS. 4 through 9.

Figure 4A:
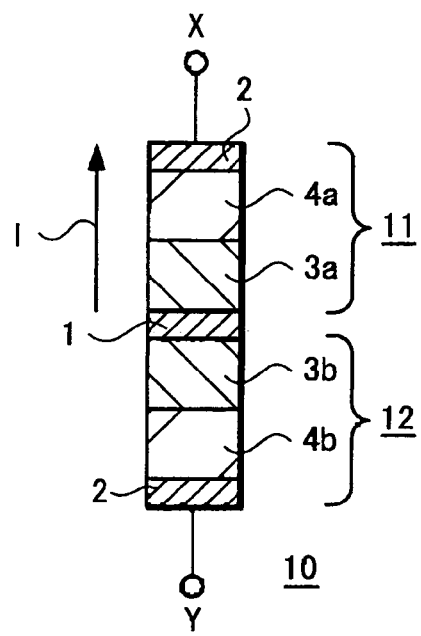
FIG. 4A is a schematic configuration diagram of a memory element according to an embodiment of the present invention.
Figure 4B:
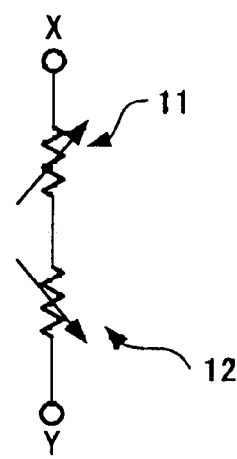
FIG. 4B is a circuit configuration diagram of the memory element of FIG. 4A.

FIGS. 4A and 4B show schematic configuration diagrams of a memory element according to an embodiment of the present invention. FIG. 4A shows a schematic configuration diagram, and FIG. 4B shows a circuit configuration diagram.

As shown in FIG. 4A, a memory element 10 according to this embodiment includes the first variable resistance element 11 and the second variable resistance element 12, both of which are nonvolatile. Both of the variable resistance elements 11 and 12 have a film structure in which the conductive films 3 [3a, 3b] and insulation films 4 [4a, 4b] are provided between the electrodes 1 and 2.

Further, by sharing the electrode 1 on the side of the conductive films 3a and 3b and by connecting the electrodes 2 on the sides of the insulation films 4a and 4b to the terminal X and to the terminal Y respectively in the two variable resistance elements 11 and 12, the memory element 10 of complementary two terminals is configured. With a circuit symbol, arrow marks of the two variable resistance elements 11 and 12 become back to back as shown in FIG. 4B.

As the conductive films 3 [3a, 3b] that constitutes the first and second variable resistance elements 11 and 12, a metal film, alloy film (for example, a CuTe alloy film), metal compound film and the like containing a metal element such as Cu, Ag, and Zn, for example, can be listed.

Further, an insulator of an amorphous $Gd_2O_3$, $SiO_2$ and the like, for example, can be listed as the insulation films 4 [4a, 4b].

As a specific film structure, a CuTe film is formed into a film thickness of 20 nm as the conductive films 3 [3a, 3b] and an amorphous $Gd_2O_3$ film is formed into a film thickness of 5 nm as the insulation films 4 [4a, 4b], for example.

When such material films are used, those metal films have a property that the metal element such as Cu, Ag, and Zn contained in the conductive films 3 [3a, 3b] is ionized and drawn to a cathode side.

Therefore, when a voltage is applied between the upper and lower electrodes 1 and 2 of the variable resistance elements 11 and 12 such that the electrode 2 on the side of the insulation film 4 becomes low potential, the ion of the metal element is drawn to the electrode 2 and enters the insulation film 4. Then, when the ion reaches the electrode 2, the resistance value decreases due to the conduction between the upper and lower electrodes 1 and 2.

On the other hand, when a voltage is applied between the upper and lower electrodes 1 and 2 of the variable resistance elements 11 and 12 such that the electrode 1 on the side of the conductive film 3 becomes low potential, the resistance value is raised due to the increase in electric insulation between the upper and lower electrodes 1 and 2, because the metal element is ionized and drawn to the electrode 1 from the insulation film 4.

The resistance values of the variable resistance elements 11 and 12 can be changed reversibly between the high resistance state and the low resistance state by repeating such change.

The variable resistance elements 11 and 12 of such film structure have an advantage with respect to scaling, because there is no dependence on a size of an element and a large signal can be obtained.

Further, the variable resistance elements 11 and 12 have such advantages that a data writing speed by the resistance change can be made faster to be a speed of around 5 nanoseconds, for example, and it is possible to operate at a low voltage (for example, around 1V) and also at a low current (for example, around 20 µA).

Figure 5A:
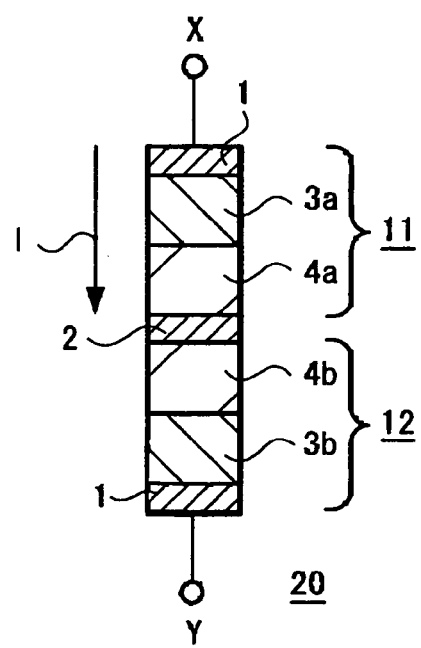
FIG. 5A is a schematic configuration diagram of a memory element according to another embodiment of the present invention.
Figure 5B:
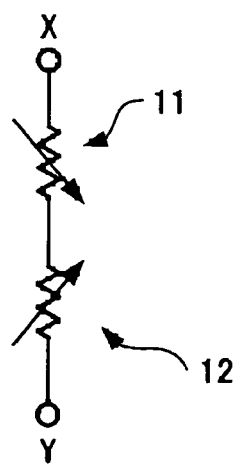
FIG. 5B is a circuit configuration diagram of the memory element of FIG. 5A.

FIGS. 5A and 5B show schematic configuration diagrams of a memory element according to another embodiment of the present invention. FIG. 5A shows a schematic configuration diagram, and FIG. 5B shows a circuit configuration diagram.

As shown in FIG. 5A, this memory element 20 includes the first variable resistance element 11 and the second variable resistance element 12, similarly to FIG. 4A. By sharing the electrode 2 (what is called a common electrode) on the side of the insulation films 4 [4a, 4b] and by connecting the electrodes 1 on the sides of the conductive films 3 [3a, 3b] to the terminal X and to the terminal Y respectively in the two variable resistance elements 11 and 12, the memory element 20 of complementary two terminals is configured. With a circuit symbol, arrow marks of the two variable resistance elements 11 and 12 become face to face as shown in FIG. 5B.

Next, a specific operation in the configuration of the memory element 10 of the embodiment shown in FIG. 4 is explained. Four possible states of the memory element 10 are shown in FIGS. 6A through 6D.

Figures 6A, 6B, 6C, 6D:
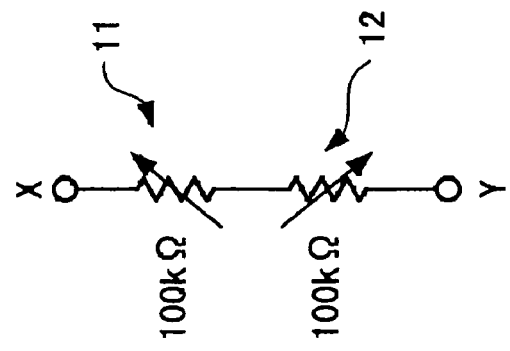
FIGS. 6A through 6D are diagrams showing a possible state of the memory element of FIG. 4A.

As shown in FIG. 6A, a state in which the first variable resistance element 11 connected to the terminal X is in a low resistance (for example, 1 kΩ) and the second variable resistance element 12 connected to the terminal Y is in a high resistance (for example, 100 kΩ) is defined as an "S=1 state", and as shown in FIG. 6B, a state in which the first variable resistance element 11 connected to the terminal X is in a high resistance (for example, 100 kΩ) and the second variable resistance element 12 connected to the terminal Y is in a low resistance (for example, 1 kΩ) is defined as an "S=0 state".

Further, as shown in FIG. 6C, a state in which both of the two variable resistance elements 11 and 12 are in the low resistance is termed an "intermediate state", and as shown in FIG. 6D, a state in which both of the two variable resistance elements 11 and 12 are in the high resistance is termed a "forbidden state".

Note that in the case where the configuration of the memory element 20 of the embodiment shown in FIG. 5 is used, similar operation is performed except that the directions of the arrow marks of the variable resistance elements 11 and 12 are switched to be opposite to the cases shown in FIGS. 6A through 6D.

Next, FIG. 7A shows a state transition diagram for explaining an operation in the case where voltages Vx and Vy for writing are applied to the terminals X and Y in order to write data into the memory element 10. FIG. 7B and FIG. 7C show a status of a transition current at the time of "S=1 state" to "S=0 state" and a status of a transition current at the time of "S=0 state" to "S=1 state", respectively. In order to supplement the state transition diagram of FIG. 7, FIGS. 8A through 8H show the voltages Vx and Vy, voltages V11 and V12 applied to the variable resistance elements 11 and 12, and an electric current Ixy that flows in the elements in each state. As for the voltages V11 and V12, a direction of the voltage that causes a change to low resistance is assumed as a positive polarity. As for the Ixy, a direction of the flow from the terminal X to the terminal Y is assumed as a positive polarity.

In FIG. 7A, (a resistance value of the first variable resistance element 11/a resistance value of the second variable resistance element 12) is described in a circle of each state as the resistance values of the variable resistance elements 11 and 12, a transition of each state is shown by an arrow mark, and with respect to this arrow mark, {Vx, Vy}/Ixy is described as a voltage applied to each of the terminals X and Y of the memory element 10 and an electric current that flows in the element.

Further, it is assumed that followings are satisfied:

0.3V<Ver<1.0V, 0.3V<Vwr<2.0V where a data writing threshold value of each of the variable resistance elements 11 and 12 is defined as a Vwr and a data erasure threshold value is defined as a Ver. Although numerical values used here are also not necessarily accurate, those are generally appropriate numerical values.

First, in case of the "S=1 state" (1 kΩ/100 kΩ) shown on the upper side of FIG. 7A, the first variable resistance element 11 connected to the terminal X is in the low resistance (1 kΩ) and the second variable resistance element 12 connected to the terminal Y is in the high resistance (100 kΩ). When voltages of Vx=0V and Vy=2V are applied in this state, a constant current of Ixy=−20 µA flows from the terminal X to the terminal Y: this is a stable direction for both the first variable resistance element 11 of the low resistance and the second variable resistance element 12 of the high resistance as shown in FIG. 8A. Therefore, the state of each of the variable resistance elements 11 and 12 does not change as shown by an arrow mark ({0V, 2V}/−20 µA) above the circle indicating the "S=1 state" in FIG. 7A.

Next, when voltages of Vx=2V and Vy=0V are applied in the "S=1 state" (1 kΩ/100 kΩ), since the second variable resistance element 12 is in the high resistance (100 kΩ), the voltage 2V of the writing direction is applied to the second variable resistance element 12 of the high resistance as shown in FIG. 8B, and therefore the second variable resistance element 12 changes to the low resistance (1 kΩ) and the state makes a transition from the "S=1 state" to the "intermediate state" as shown in FIG. 8C. Accordingly, the transition is made from the "S=1 state" (1 kΩ/100 kΩ) shown on the upper side of FIG. 7A to the "intermediate state" (1 kΩ/1 kΩ) shown on the right side of FIG. 7A.

In this intermediate state (1 kΩ/1 kΩ), since both of the two variable resistance elements 11 and 12 are in the low resistance (1 kΩ), the voltage of 2V between X and Y is divided into halves as shown in FIG. 8C, and a voltage of 1V is applied to the first variable resistance element 11 in the erasing direction. Then, the first variable resistance element 11 changes to the high resistance (100 kΩ), and the state makes the transition to the "S=0 state" to become a stable state as shown in FIG. 8D. Accordingly, the transition is made from the intermediate state (1 kΩ/1 kΩ) shown on the right side to the "S=0 state" (100 kΩ/1 kΩ) shown on the lower side in FIG. 7A.

FIG. 7B shows changes on the time axis with respect to the voltage Vx-Vy at the time of transition from the "S=1 state" to the "S=0 state" and the electric current Ixy that flows in the elements.

Although a comparatively large transition current of +1 mA is generated in the intermediate state, a period of time of the intermediate state is around 10 nanoseconds, which is short, and the power consumption is small.

Similarly, in case of the "S=0 state" (100 kΩ/1 kΩ) shown on the lower side of FIG. 7A, the first variable resistance element 11 connected to the terminal X is in the high resistance (100 kΩ) and the second variable resistance element 12 connected to the terminal Y is in the low resistance (1 kΩ). When the voltages of Vx=2V and Vy=0V are applied in this state, a constant current Ixy=+20 µA flows from the terminal X to the terminal Y: this is a stable direction for both the second variable resistance element 12 of the low resistance and the first variable resistance element 11 of the high resistance as shown in FIG. 8D. Accordingly, the state of each of the variable resistance elements 11 and 12 does not change as shown by an arrow mark ({2V, 0V}/+20 µA) under the circle indicating the "S=0 state" in FIG. 7A.

Next, when the voltages of Vx=0V and Vy=2V are applied in the "S=0 state" (100 kΩ/1 kΩ), since the first variable resistance element 11 is in the high resistance (100 kΩ), the voltage 2V of the writing direction is applied to the first variable resistance element 11 of the high resistance as shown in FIG. 8E, and therefore the first variable resistance element 11 changes to the low resistance (1 kΩ) and the state makes the transition from the "S=0 state" to the "intermediate state" as shown in FIG. 8F. Accordingly, the transition is made from the "S=0 state" (100 kΩ/1 kΩ) shown on the lower side to the intermediate state (1 kΩ/1 kΩ) shown on the left side in FIG. 7A.

In this intermediate state (1 kΩ/1 kΩ), since both of the two variable resistance elements 11 and 12 are in the low resistance (1 kΩ), the voltage of 2V between X and Y is divided into halves as shown in FIG. 8F, and the voltage of 1V is applied to the second variable resistance element 12 in the erasing direction. Then, the second variable resistance element 12 changes to the high resistance (100 kΩ), and the state makes the transition to the "S=1 state" to be a stable state as shown in FIG. 8A. Accordingly, the transition is made from the intermediate state (1 kΩ/1 kΩ) shown on the left side to the "S=1 state" (1 kΩ/100 kΩ) shown on the upper side in FIG. 7A.

FIG. 7C shows changes on the time axis with respect to the voltage Vx-Vy at the time of transition from the "S=0 state" to the "S=1 state" and the electric current Ixy that flows in the elements.

Although a comparatively large transition current of −1 mA is generated in the intermediate state, a period of time of the intermediate state is around 10 nanoseconds, which is short, and the power consumption is small.

Thus, in the memory element 10 of this embodiment, the two variable resistance elements 11 and 12 complementarily connected have different resistance values of the high resistance and low resistance respectively, and whether recorded data is 1 or 0 is distinguished depending on the element which is in the low resistance.

In addition, when data is rewritten, the transition is made to the stable "S=1 state" or "S=0 state" through the unstable "intermediate state".

In order to perform such rewriting operation repeatedly, it is necessary that a voltage of about one half the voltage at the time of writing is applied in the reverse direction to the nonvolatile variable resistance elements 11 and 12 used for the memory element 10 to erase data.

In addition, such data rewriting operation can be performed by applying to the terminals X and Y on the both sides a voltage which is larger than the data writing threshold value Vwr of the variable resistance elements 11 and 12 and also which is larger than twice the data erasing threshold value Ver.

Further, recorded information before the rewriting can be read by judging the presence or absence of the transition current at the time of rewriting operation, specifically, can be read by detecting the presence or absence of the intermediate state. For example, when the voltages of Vx=2V and Vy=0V are applied and the transition current +1 mA is generated, it can be judged that the transition from the "S=1 state" to the "S=0 state" has occurred and it can be identified that the state before the rewriting has been the "S=1 state". If the transition current is not generated, it can be identified that the state before the rewriting has been the "S=0 state" and the rewriting has not occurred. In the former case, due to the destructive reading, rewriting to the "S=1 state" is necessary after the readout.

Similarly, when the voltages of Vx=0V and Vy=2V are applied and the transition current −1 mA is generated, it can be judged that the transition from the "S=0 state" to the "S=1 state" has occurred and it can be identified that the state before the rewriting has been the "S=0 state". If the transition current is not generated, it can be identified that the state before the rewriting has been the "S=1 state" and the rewriting has also not occurred. In the former case, due to the destructive reading, rewriting to the "S=0 state" is necessary after the readout.

Furthermore, the "forbidden state" shown in FIG. 6D, specifically, the state in which both of the two variable resistance elements 11 and 12 are in the high resistance, is an initial state of the memory element 10. In this state, as shown in FIG. 8G or FIG. 8H, even if a potential difference of 2V is given to the terminals X and Y on the both sides, neither of the variable resistance elements 11 and 12 becomes the low resistance.

Therefore, it is necessary to perform such an operation (initialization) that both of or one of the nonvolatile variable resistance elements 11 and 12 is made to the low resistance by applying the voltage (constant voltage or pulse voltage) of around twice the data writing threshold value Vwr between the terminals X and Y on the both sides. With this operation, the memory element 10 enters the state transition cycle shown in FIG. 7, and an operation of data writing and data erasure becomes possible.

In this memory element 10, the combined resistance of the two variable resistance elements 11 and 12 is constant in the "S=1 state" and "S=0 state" that are two stable states and becomes almost the same as the value of the high resistance.

Therefore, the electric current that flows at the time when applying the writing and reading voltage is only 20 μA in this embodiment. Although the high resistance state of each of the variable resistance elements 11 and 12 is set to 100 kΩ in order to facilitate the explanation of the operation, the electric current can be reduced to 2 μA or less when the high resistance state is designed to become 1 MΩ to 1 TΩ.

Although the transition current of 1 mA flows when the transition occurs in the "S=1 state" and "S=0 state", a period of time is around 10 nanoseconds, which is short, and the power consumption is small. Furthermore, when the low resistance state is designed to be 10 kΩ to 100 kΩ, the transition current can be reduced to 100 μA or less.

Accordingly, the electric current that flows in the memory cell is reduced to reduce the power consumption of the memory element. A typical problem of a nonvolatile memory, which includes such a variable resistance element that the power consumption becomes large due to a large electric current flowing when a voltage is applied to an element which has become a low resistance, can be solved by using the combined resistance of the two variable resistance elements 11 and 12 according to the embodiments of the present invention. Hence, the memory elements 10 and 20 of the above-described embodiments can be used as a basic element constituting a memory and the like in which information does not disappear even if the power is shut off.

With a large number of memory elements 10 and 20 according to each of the above-described embodiments being disposed in matrix form, a memory device can be made.

Further, a memory device whose power consumption is small can be obtained by using the memory elements 10 and 20 of each of the above-described embodiments.

Figure 9A:
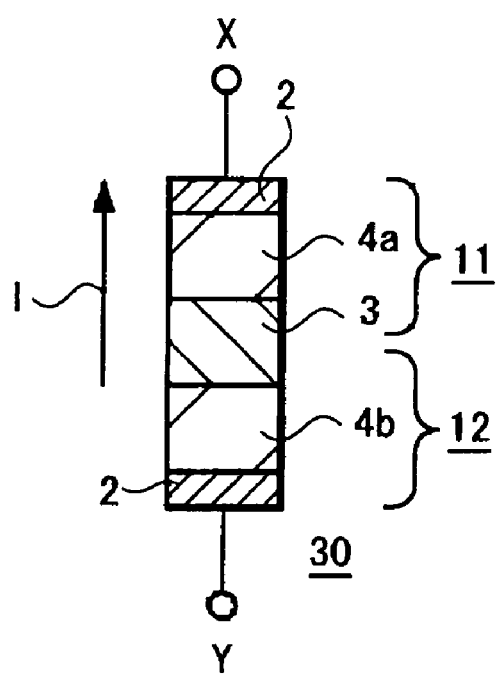
FIG. 9A is a schematic configuration diagram of a memory element according to further another embodiment of the present invention.
Figure 9B:
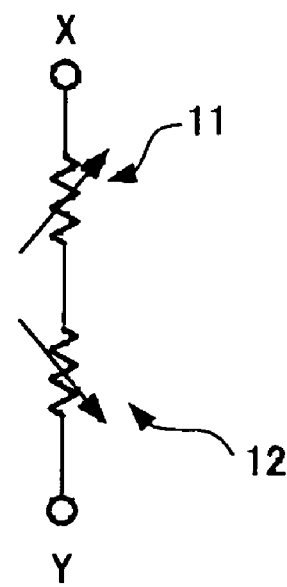
FIG. 9B is a circuit configuration diagram of the memory element of FIG. 9A.

Subsequently, FIG. 9A shows an schematic configuration diagram of a memory element according to further another embodiment of the present invention. Specifically, FIG. 9A is the schematic configuration diagram in which the two variable resistance elements 11 and 12 share one conductive film 3. An equivalent circuit of a memory element 30 is shown in FIG. 9B. Since the equivalent circuit of FIG. 9B is the same as FIG. 4B and the memory element 30 of this embodiment performs the same operation as that of the memory element 10 shown in FIG. 4A, a redundant explanation is omitted.

In the memory element 30 according to this embodiment, the electrode 1 (what is called a common electrode) of FIG. 4A is not provided and the first variable resistance element 11 and the second variable resistance element 12, both of which are nonvolatile, are included. The variable resistance elements 11 and 12 have a film structure including the shared conductive film 3 and each of the insulation films 4a and 4b respectively between the electrodes 2. Further, by connecting the electrodes 2 on the sides of the insulation films 4a and 4b to the terminal X and to the terminal Y in the two variable resistance elements 11 and 12 respectively, the memory element 30 of complementary two terminals is configured. A film thickness of the shared conductive film 3 shown in FIG. 9A may be made into a film thickness equivalent to one of the conductive films 3a and 3b in FIG. 4A or may be set arbitrarily. With a circuit symbol, arrow marks of the two variable resistance elements 11 and 12 become back to back as shown in FIG. 9B.

According to the memory element 30 of this embodiment, similar effectiveness to the above-described memory elements 10 and 20 can be obtained, further a structure of variable resistance elements laminated can be simplified with the conductive film 3 being shared by variable resistance elements 11 and 12, and a manufacturing process can be simplified.

According to the memory elements 10, 20, and 30 according to the above-described embodiments, since the electrode of one side in each element of the two variable resistance elements 11 and 12 is connected and the electrode of the other side in each element of the two variable resistance elements 11 and 12 is made independent and is provided with the terminal respectively to form a memory cell having two terminals in total, and since the electrodes of one side are connected, it becomes possible to perform the recording of information by operating those two variable resistance elements complementarily.

Specifically, since the electrodes of one side are connected, the two variable resistance elements are connected in series between the electrodes of the other sides of the two variable resistance elements 11 and 12. Further, when a voltage is applied between the electrodes of the other sides, the voltage acts on one of the two variable resistance elements to change from the high resistance state to the low resistance state, and acts on the other of the two variable resistance elements to change from the low resistance state to the high resistance state. Hence, one of the variable resistance elements can be changed to the low resistance state and the other of the variable resistance element can be changed to the high resistance state respectively, and the state after the change can be maintained stably.

Further, when a voltage of reverse polarity to the above-described voltage is applied between the electrodes of the other sides, one of the variable resistance elements is changed to the high resistance state and the other of the variable resistance elements is changed to the low resistance state respectively, and thereby the combination of the resistance states of the first variable resistance element 11 and second variable resistance element 12 can be changed to rewrite information.

By using this, two kinds of information of "1" and "0", for example, can be stored in each memory cell with a case in which the combination of the resistance states of the first variable resistance element 11 and second variable resistance element 12 is the high resistance state and low resistance state, and a case in which the combination thereof is the low resistance state and high resistance state.

Furthermore, when the resistance state of the two variable resistance elements 11 and 12 changes, the variable resistance element that has been in the high resistance state changes first to the low resistance state, and after that, the variable resistance element that has been in the low resistance state changes to the high resistance state, and therefore the resistance state goes through the intermediate state in which both of the two variable resistance elements become the low resistance state.

Further, since a period of time to become the intermediate state is short and one of the two variable resistance elements 11 and 12 is in the high resistance state except for the period of time, the combined resistance of the whole memory cell becomes large, and the electric current that flows in the memory cell is small. Hence, the electric current that flows when applying the voltage to the memory cell can be reduced at the time of recording information.

Furthermore, recorded information before the recording can be read by detecting the presence or absence of the transition current at the time of recording information, specifically, by detecting the presence or absence of the intermediate state.

According to the method of driving the memory element in the embodiment of the present invention, the variable resistance elements 11 and 12 are configured to have the threshold values of voltage respectively at the time of changing reversibly between the high resistance state and the low resistance state when the above-described memory elements 10, 20, and 30 of the embodiments of the present invention are driven, and the combination of the resistance states of the first variable resistance element 11 and second variable resistance element 12 is easily changed by applying a larger voltage than the threshold value of voltage to the terminals at the both ends of the memory element, so that the recording of information can be performed.

Further, the above-described memory element 10 according to the embodiment of the present invention may include the variable resistance elements 11 and 12, in which the conductive film 3 and the insulation film 4 are formed between the electrode of one side and the electrode of the other side respectively, each of which has the characteristic of changing from the high resistance state to the low resistance state when the voltage is applied to make the electric current flow from the conductive film 3 toward the insulation film 4 and of changing from the low resistance state to the high resistance state when the voltage is applied to make the electric current flow from the insulation film 4 toward the conductive film 3, and in which electrodes 1 on the sides of the conductive films 3a and 3b are connected.

Alternatively, the above-described memory element 20 according to the embodiment of the present invention may include the variable resistance elements 11 and 12, in which the conductive film 3 and the insulation film 4 are formed between the electrode of one side and the electrode of the other side respectively, each of which has the characteristic of changing from the high resistance state to the low resistance state when the voltage is applied to make the electric current flow from the conductive film 3 toward the insulation film 4 and of changing from the low resistance state to the high resistance state when the voltage is applied to make the electric current flow from the insulation film 4 toward the conductive film 3, and in which the electrodes 2 on the side of the insulation films 4 are connected.

Further, the above-described memory element 30 according to the embodiment of the present invention may include the variable resistance elements 11 and 12, in which the conductive film 3 and the insulation film 4 are formed between the electrode of one side and the electrode of the other side respectively, each of which has the characteristic of changing from the high resistance state to the low resistance state when the voltage is applied to make the electric current flow from the conductive film 3 toward the insulation film 4 and of changing from the low resistance state to the high resistance state when the voltage is applied to make the electric current flow from the insulation film 4 toward the conductive film 3, and in which the above-described conductive film 3 is shared.

With the memory elements 10, 20 and 30 thus configured, since the variable resistance elements 11 and 12 are configured such that the conductive film 3 and the insulation film 4 are formed between the electrode of one side and the electrode of the other side to have the characteristic of changing from the high resistance state to the low resistance state when the voltage is applied to make the electric current flow from the conductive film 3 toward the insulation film 4 and of changing from the low resistance state to the high resistance state when the voltage is applied to make the electric current flow from the insulation film 4 toward the conductive film 3, the resistance values of the variable resistance elements 11 and 12 can be changed reversibly between the high resistance state and the low resistance state.

Further, there is no dependence on a size of an element, and a large signal can be obtained. In addition, the recording of information can be performed at a high speed, and it is possible to operate at a low voltage and at a low electric current.

A memory device can be configured by disposing a large number of the memory elements 10, 20, and 30 of the above-described embodiments in a matrix form.

Further, a memory device whose power consumption is small can be obtained by using the memory elements 10, 20 and 30 of the above-described embodiments.

A memory device integrating a large number of memory elements can be integrated into a small area by making the two variable resistance elements laminated.

Here, the writing threshold value Vwr and erasure threshold value Ver of the variable resistance elements 11 and 12, can be controlled by selecting a material, film composition, film thickness and the like of the conductive film 3 or insulation film 4 in case of the film structures respectively shown in FIGS. 4A, 5A, and 9A.

In the above-described embodiments, the variable resistance elements 11 and 12 constituting the memory elements 10, 20, and 30 respectively includes the conductive film and insulation film between the two electrodes, however, other configurations are conceivable.

For example, a semi-conductive film may be used instead of the conductive film, a semi-conductive film and a conductive film may be used instead of the insulation film. The order of lamination may be reversed, and even a single layer may be employed. In either configuration, a variable resistance element only needs to have a characteristic of changing between a high resistance state and a low resistance state by applying a voltage and further to have a threshold value of voltage by which the resistance state changes.

It should be noted that a resistance value of the variable resistance element, a magnitude of the voltage applied to the terminals, and the like are not limited to the configurations shown in the above-described embodiments, but other wide range of configurations are also possible.

The present invention is not limited to the above-described embodiments, but other various configurations can be effected without departing from the scope or spirit of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element comprising a variable resistance element whose resistance state changes reversibly between a high resistance state and a low resistance state by applying a voltage of a different polarity between an electrode of one side and an electrode of an other side,
wherein
said electrode of one side in each element of two said variable resistance elements is made a common electrode, the common electrode not directly receiving an external signal;
said electrode of the other side in each element of two said variable resistance elements is made independent and is respectively provided with a terminal to configure a memory cell having two terminals in total;
each of said two variable resistance elements
includes a conductive film and an insulation film which are formed between said electrode of one side and said electrode of the other side, and
has a characteristic of changing from said high resistance state to said low resistance state when a voltage is applied to make an electric current flow from said conductive film toward said insulation film and of changing from said low resistance state to said high resistance state when a voltage is applied to make an electric current flow from said insulation film toward said conductive film; and
the electrodes on a conductive film side of each of said two variable resistance elements are connected to be said common electrode.

2. A memory element according to claim 1,
wherein said variable resistance element has a threshold value of voltage respectively when changing reversibly between said high resistance state and said low resistance state.

3. A memory element comprising a variable resistance element whose resistance state changes reversibly between a high resistance state and a low resistance state by applying a voltage of a different polarity between an electrode of one side and an electrode of an other side,
wherein
said electrode of one side in each element of two said variable resistance elements is made a common electrode, the common electrode not directly receiving an external signal;
said electrode of the other side in each element of two said variable resistance elements is made independent and is respectively provided with a terminal to configure a memory cell having two terminals in total;
each of said two variable resistance elements
includes a conductive film and an insulation film which are formed between said electrode of one side and said electrode of the other side, and
has a characteristic of changing from said high resistance state to said low resistance state when a voltage is applied to make an electric current flow from said conductive film toward said insulation film and of changing from said low resistance state to said high resistance state when a voltage is applied to make an electric current flow from said insulation film toward said conductive film; and
the electrode on an insulation film side of each of said two variable resistance elements are connected to be said common electrode.

4. A memory element comprising:
a variable resistance element whose resistance state changes reversibly between a high resistance state and a low resistance state by applying a voltage of a different polarity between an electrode of one side and an electrode of an other side,
wherein the memory element is formed of two said variable resistance elements,
wherein said electrode of one side in each element of the two said variable resistance elements is made a common electrode, the common electrode not directly receiving an external signal, and said electrode of the other side in each element of two said variable resistance elements is made independent and is respectively provided with a terminal to configure a memory cell having two terminals in total, and
wherein each of said two variable resistance elements
includes an insulation film that is formed in each element and a conductive film that is formed in common with respect to said two variable resistance elements, and
has a characteristic of changing from said high resistance state to said low resistance state when a voltage is applied to make an electric current flow from said conductive film toward said insulation film and of changing from said low resistance state to said high resistance state when a voltage is applied to make an electric current flow from said insulation film toward said conductive film.

5. A memory element according to claim 4,
wherein said variable resistance element has a threshold value of voltage respectively when changing reversibly between said high resistance state and said low resistance state.

6. A method of driving a memory element including a variable resistance element whose resistance state changes reversibly between a high resistance state and a low resistance state by applying a voltage of a different polarity between an electrode of one side and an electrode of an other side, in which
said electrode of one side in each element of two said variable resistance elements is connected, the connected electrode not directly receiving an external signal,
said electrode of the other side in each element of two said variable resistance elements is made independent and is respectively provided with a terminal to form a memory cell having two terminals in total, and
said variable resistance elements includes a conductive film and an insulation film which are formed between said electrode of one side and said electrode of the other side,
the method comprising the steps of:
setting a threshold value of voltage respectively when said variable resistance element changes reversibly between said high resistance state and said low resistance state,
recording information by applying a larger voltage than said threshold value of voltage to the terminals at both ends of said memory element, and reading information recorded in the memory element by detecting a presence or absence of a transition current that flows at a time of said recording of information.

7. A method of driving a memory element including a variable resistance element whose resistance state changes reversibly between a high resistance state and a low resistance state by applying a voltage of a different polarity between an electrode of one side and an electrode of an other side, in which the memory element is formed of two said variable resistance elements, each of said two variable resistance elements includes an insulation film that is formed respectively in each element and a conductive film that is formed in common in said two variable resistance elements, and a terminal is provided respectively to both electrodes on an insulation film side of said variable resistance element to form a memory cell having two electrodes and two terminals in total, and said variable resistance elements includes a conductive film and an insulation film which are formed between said electrode of one side and said electrode of the other side, the method comprising the steps of:

setting a threshold value of voltage respectively when said variable resistance element changes reversibly between said high resistance state and said low resistance state, recording information by applying a larger voltage than said threshold value of voltage to the terminals at both ends of said memory element, and reading information recorded in the memory element by detecting a presence or absence of a transition current that flows at a time of said recording of information.

8. A memory element according to claim 3, wherein said variable resistance element has a threshold value of voltage respectively when changing reversibly between said high resistance state and said low resistance state.

9. The memory element of claim 1, wherein said variable resistance element is initialized by applying an initialization voltage of a magnitude twice that of a data writing voltage.

10. The memory element of claim 3, wherein said variable resistance element is initialized by applying an initialization voltage of a magnitude twice that of a data writing voltage.

11. The memory element of claim 4, wherein said variable resistance element is initialized by applying an initialization voltage of a magnitude twice that of a data writing voltage.

12. The method of claim 6, wherein said variable resistance element is initialized by applying an initialization voltage of a magnitude twice that of a data writing voltage.

13. The method of claim 7, wherein said variable resistance element is initialized by applying an initialization voltage of a magnitude twice that of a data writing voltage.

* * * * *